(12) United States Patent
Haji et al.

(10) Patent No.: US 8,614,118 B2
(45) Date of Patent: Dec. 24, 2013

(54) COMPONENT BONDING METHOD, COMPONENT LAMINATING METHOD AND BONDED COMPONENT STRUCTURE

(75) Inventors: Hiroshi Haji, Fukuoka (JP); Mitsuru Ozono, Fukuoka (JP); Teruaki Kasai, Fukuoka (JP); Masaru Nonomura, Fukuoka (JP)

(73) Assignee: Panasonic Corporation, Osaka (JP)

( * ) Notice: Subject to any disclaimer, the term of this patent is extended or adjusted under 35 U.S.C. 154(b) by 23 days.

(21) Appl. No.: 12/280,615

(22) PCT Filed: Feb. 9, 2007

(86) PCT No.: PCT/JP2007/052409
§ 371 (c)(1),
(2), (4) Date: Aug. 25, 2008

(87) PCT Pub. No.: WO2007/099759
PCT Pub. Date: Sep. 7, 2007

(65) Prior Publication Data
US 2009/0035892 A1    Feb. 5, 2009

(30) Foreign Application Priority Data
Feb. 28, 2006   (JP) .................. 2006-051729

(51) Int. Cl.
*H01L 21/00*   (2006.01)
(52) U.S. Cl.
USPC ................... 438/118; 257/E23.04
(58) Field of Classification Search
USPC ................... 438/118; 257/E23.04
See application file for complete search history.

(56) References Cited

U.S. PATENT DOCUMENTS

| 4,639,285 A * | 1/1987 | Suzuki et al. ............. 156/272.6 |
| 6,981,317 B1 | 1/2006 | Nishida |
| 7,087,181 B2 * | 8/2006 | Schmidt et al. ................. 216/39 |
| 7,148,081 B2 | 12/2006 | Higashino et al. |
| 2004/0241907 A1 | 12/2004 | Higashino et al. |

FOREIGN PATENT DOCUMENTS

| JP | 11-111739 A | 4/1999 |
| JP | 11-145120 | 5/1999 |

(Continued)

OTHER PUBLICATIONS

International Search Report.

*Primary Examiner* — Amar Movva
(74) *Attorney, Agent, or Firm* — Pearne & Gordon LLP

(57) ABSTRACT

Provided is a component bonding method of bonding a semiconductor component having a thermosetting adhesive layer formed on a lower surface thereof to a circuit board having a resin layer formed on a surface thereof. In the method, wettability is improved by surface modification that performs a plasma treatment on a resin surface of the circuit board, the semiconductor component is held by a component holding nozzle having a heater, the adhesive layer is contacted to the surface-modified resin layer, and the adhesive layer is heated and thermally cured by the heater. Thereby, adhesion between the adhesive layer and the resin surface is improved, and thus the component holding nozzle can be separated from the semiconductor component without wait for completely hardening the adhesive layer. Accordingly, it is possible to improve productivity in the heat pressing process by reducing the time required for the component bonding.

6 Claims, 10 Drawing Sheets

(56) References Cited

FOREIGN PATENT DOCUMENTS

| | | | |
|---|---|---|---|
| JP | 11145120 A * | 5/1999 | |
| JP | 11-251335 | 9/1999 | |
| JP | 11251335 A * | 9/1999 | |
| JP | 2001-185563 A | 7/2001 | |
| JP | 2003-264205 A | 9/2003 | |
| JP | 2004-356529 A | 12/2004 | |
| JP | 2005-251779 A | 9/2005 | |
| JP | 2005-294285 A | 10/2005 | |
| KR | 2000-0062375 A | 10/2000 | |

* cited by examiner

COMPONENT BONDING METHOD, COMPONENT LAMINATING METHOD AND BONDED COMPONENT STRUCTURE

TECHNICAL FIELD

The present invention relates to a component bonding method of bonding a semiconductor component having a thermosetting adhesive layer to a circuit board having a resin layer formed on a surface thereof. In addition, the invention also relates to a component laminating method of laminating on a circuit board a plurality of components each of which has a resin layer formed on one surface thereof and a thermosetting adhesive layer formed on the other surface thereof.

BACKGROUND ART

In a process of manufacturing a semiconductor apparatus, each of semiconductor devices cut from a semiconductor wafer is mounted on a circuit board such as a lead frame or a flexible circuit board with a bonding agent interleaved therebetween. As a process of mounting semiconductor devices on a circuit board, a method of mounting semiconductor devices on a bonding agent that is previously coated on a circuit board has been generally employed, but recently it becomes difficult to directly apply such a conventional method, as semiconductor devices has become thinner.

Specifically, in order to satisfactorily bond a semiconductor device to a circuit board, it is required to interleave a bonding agent with a thin film shape between the circuit board and the semiconductor device. However, when thin film semiconductor device being flexible and having small rigidity is mounted on the bonding agent, it is difficult to press and spread the previously coated bonding agent because of the rigidity of the semiconductor device itself. In addition, when the thin film semiconductor device is pressed on the bonding agent, the bonding agent is easily spread over the upper surface of the semiconductor device, and thus a mounting tool is easily contaminated. Thus, a problem that a normal operation for holding a component is disturbed easily arises.

Because of this, recently, a method of forming an adhesive layer on a semiconductor device itself has been employed. In this method, a die attach film formed by a semi-hardened bonding resin having a film shape is previously adhered to a semiconductor wafer of which semiconductor devices are not yet separated into pieces, and thus the adhesive layer is formed on the semiconductor device itself (for example, see Patent Document 1). With such a configuration, the semiconductor device is reinforced by the resin layer, and thus the thin film semiconductor device can be easily handled. Also, it is possible to eliminate a problem caused by the bonding agent at the time of mounting the semiconductor device on the circuit board.

Patent Document 1: Japanese Unexamined Patent Application Publication No. 2001-185563

DISCLOSURE OF THE INVENTION

Problem that the Invention is to Solve

However, in the method of mounting a semiconductor device as exemplarily shown in the known document mentioned above, it was needed to maintain a state where the semiconductor device is pressed by a heat pressing tool on the circuit board in order to thermally cure the bonding resin during a predetermined time. It generally takes second-order time for maintaining the state depending on how hardened the bonding resin should be, and so it was difficult to greatly decrease the time therefor. This makes difficult to decrease the time of the heat pressing process, and so is the factor that disturbs improvement in productivity. In addition, this has been particularly remarkable in a chip-on-chip structure mounting method of laminating thin film semiconductor components on a circuit board.

Accordingly, it is an object of the invention to provide a component bonding method and a component laminating method that can improve productivity in the heat pressing process.

Means for Solving the Problems

A component bonding method according to the invention is a component bonding method of bonding a semiconductor component having a thermosetting adhesive layer to a circuit board having a resin layer formed on a surface thereof by interleaving the adhesive layer therebetween. The component bonding method includes the steps of: modifying a surface of the resin layer by performing a plasma treatment thereon; holding the semiconductor component by using a component holding nozzle; contacting the adhesive layer to the surface-modified resin layer; and curing thermally the adhesive layer by using a heater.

A component laminating method according to the invention is a component laminating method of laminating on a circuit board a plurality of components each of which has a resin layer formed on one surface thereof and a thermosetting adhesive layer formed on the other surface thereof and which include at least a first component and a second component. The component laminating method includes the steps of: mounting the first component on the circuit board; modifying a surface of the resin layer of the first component by performing a plasma treatment thereon; holding the second component by using a component holding nozzle; contacting the adhesive layer of the second component to the surface-modified resin layer of the first component; and curing thermally the adhesive layer of the second component by using a heater.

A bonded component structure according to the invention is a bonded component structure of bonding a semiconductor component having a thermosetting adhesive layer to a circuit board having a resin layer formed on a surface thereof by interleaving the adhesive layer therebetween. The bonded component structure is formed by: modifying a surface of the resin layer by performing a plasma treatment thereon; holding the semiconductor component by using a component holding nozzle; contacting the adhesive layer to the surface-modified resin layer; and curing thermally the adhesive layer by using a heater.

Advantage of the Invention

According to the invention, a surface of the resin layer is modified by the plasma treatment, and thus it is possible to improve adhesion between the resin layer and the adhesive layer previously formed on the semiconductor component. Also, it is possible to improve productivity in the heat pressing process by reducing the time required for the component bonding.

DESCRIPTION OF REFERENCE NUMERALS AND SIGNS

Figure 1:
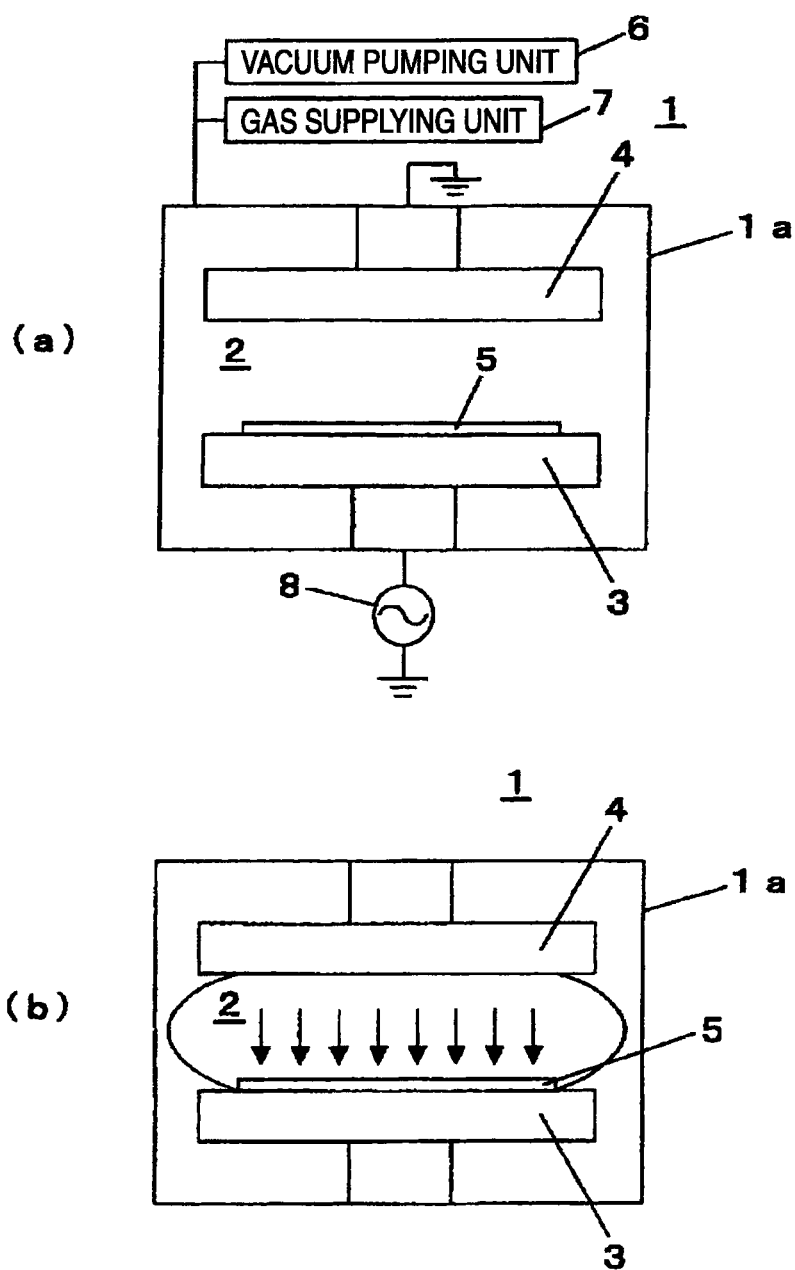
FIG. 1 is a diagram for explaining a process of a component bonding method according to an embodiment 1 of the invention.
Figure 2:
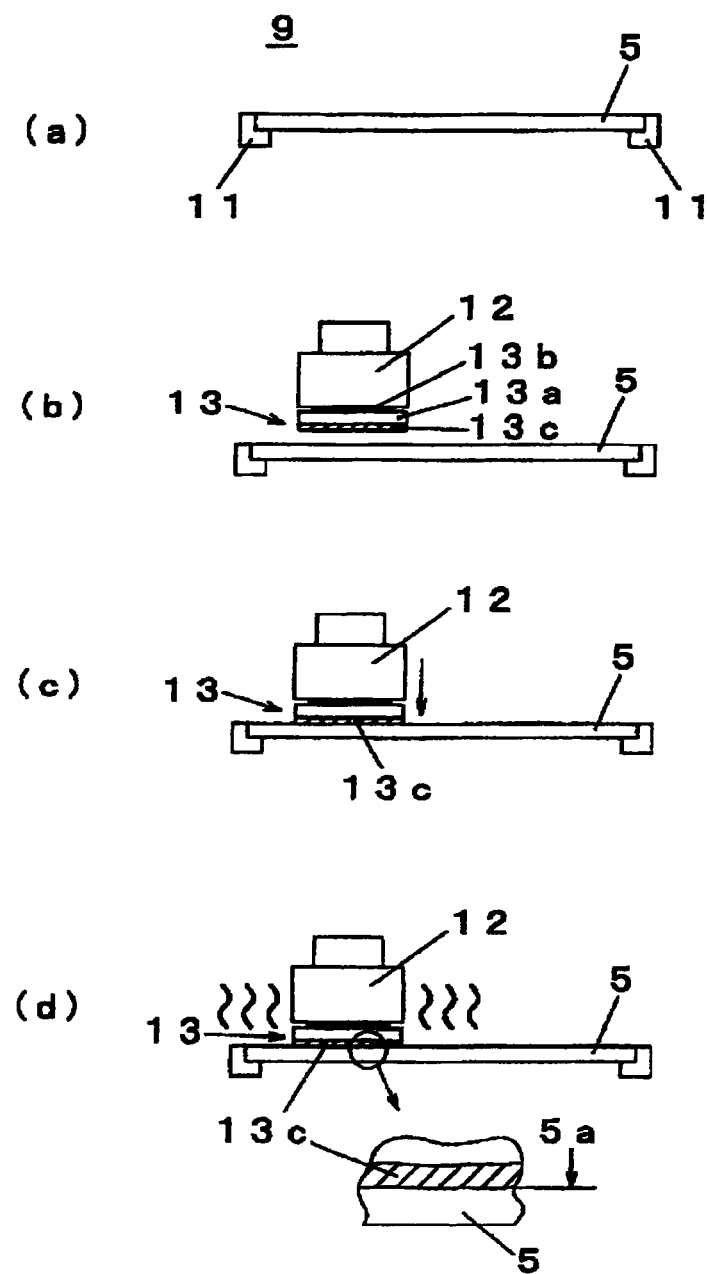
FIG. 2 is a diagram for explaining a process of the component bonding method according to the embodiment 1 of the invention.
Figure 3:
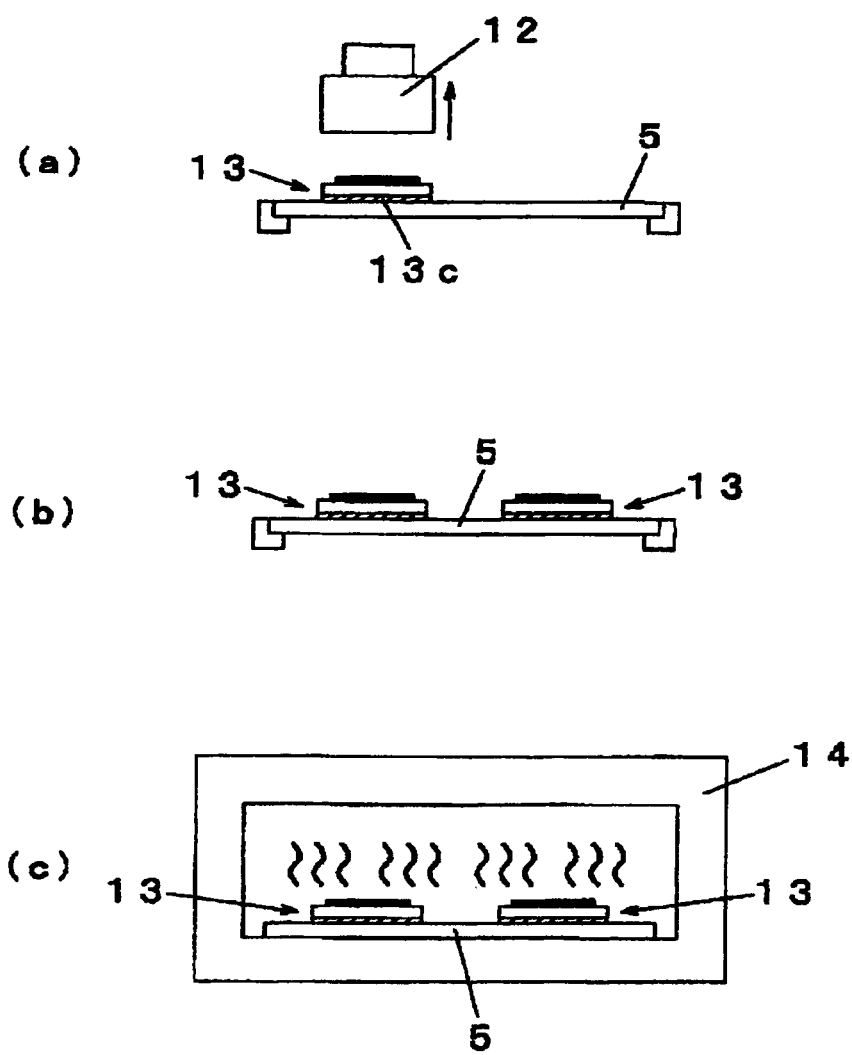
FIG. 3 is a diagram for explaining a process of the component bonding method according to the embodiment 1 of the invention.

1: PLASMA TREATMENT APPARATUS
5: CIRCUIT BOARD
9: COMPONENT MOUNTING APPARATUS
12: COMPONENT HOLDING NOZZLE
13: FIRST SEMICONDUCTOR COMPONENT (FIRST COMPONENT)
14: CURING OVEN
15, 25: 2-LAYER LAMINATED BODY
13a, 23a, 26a: SEMICONDUCTOR CHIP
13b, 23b, 26b: RESIN LAYER
13c, 23c, 26c: ADHESIVE LAYER
23: SECOND SEMICONDUCTOR COMPONENT
24: SPACER (SECOND COMPONENT)
26: THIRD SEMICONDUCTOR COMPONENT
27: 3-LAYER LAMINATED BODY

BEST MODE FOR CARRYING OUT THE INVENTION

Embodiment 1

FIGS. 1, 2, 3, 4, 5, and 6 are diagrams for explaining a process of a component bonding method according to an embodiment 1 of the invention. In the component bonding shown herein, a semiconductor component having a thermosetting adhesive layer previously formed thereon is bonded by heat pressing and is mounted on a circuit board having a resin layer such as polyimide or glass epoxy.

Ahead of the heat pressing, first, in order to improve wettability of a surface of a circuit board, plasma treatment for modifying the surface of the circuit board is performed by a plasma treatment apparatus. As shown in FIG. 1(a), a plasma treatment apparatus 1 is configured so that a lower electrode 3 and a upper electrode 4 are disposed to be opposed to each other in a treatment chamber 2 formed by an airtight vacuum chamber 1a. A circuit board 5 subject to the surface-modified treatment is placed on the lower electrode 3 with a posture in which the surface of the resin layer faces upward.

In the plasma treatment, the inside of the treatment chamber 2 is pumped out and decompressed by vacuum pumping unit 6, and subsequently plasma generation gas is supplied by a gas supplying unit 7 into the treatment chamber 2. Then, a high frequency voltage is applied between the lower electrode 3 and the upper electrode 4 by the high-frequency power source 8. In this case, as the plasma generation gas, oxygen gas or argon gas is employed. With such a configuration, as shown in FIG. 1(b), oxygen gas plasma or argon gas plasma is generated in the treatment chamber 2, and the plasma treatment is performed on a resin layer formed on the surface of the circuit board 5. By performing the plasma treatment, the surface of the resin layer is modified, and wettability of the surface thereof is improved. Specifically, in the embodiment, the surface of the resin layer formed on the surface of the circuit board 5 is modified by the plasma treatment using oxygen gas or argon gas as the plasma generation gas.

Now, the surface modification will be described. The resin such as polyimide constituting the resin layer formed on the circuit board 5 is formed by various organic bonds. In the resin layer, there are a large number of organic bonds which are bonded in unique forms among atoms including oxygen, hydrogen, carbon such as carbon-carbon bond group (C—C) or carbonyl group (C=O), and the like. Each of the organic bonds has unique bond energy, and the organic bonds are dissociated when energy larger than the bond energy is applied from outside.

In the plasma treatment for the surface modification, among plural kinds of organic bonds existing in the resin layer, a condition of plasma treatment is set to be able to selectively remove bond groups other than hydrophilic organic bond groups such as carbonyl group. Specifically, by controlling energy of charged particles generated by plasma, charged particles in energy band capable of leaving the organic bond groups such as carbonyl group having large bond energy and selectively removing carbon-carbon bond group and the like having low bond energy is made to collide. With such a configuration, a ratio of the hydrophilic organic bond groups such as carbonyl group increases in the surface layer of the resin of the circuit board 5, and wettability thereof greatly increases.

Then, the circuit board 5 after the surface modification is sent to the component mounting apparatus 9, is conveyed by a conveying tool 11, and is fixed at the component mounting position as shown in FIG. 2(a). The component mounting apparatus 9 has a function for pressing a mounting object component held by a component holding nozzle 12 having a heater on the circuit board 5. In addition, the component holding nozzle 12 firstly hold the first semiconductor component 13. Besides, the conveying tool 11 also has a heater as the need arise.

As shown in FIG. 2(b), the first semiconductor component 13 is configured so that an adhesive layer 13c is formed on a lower surface of a semiconductor chip 13a having a resin layer 13b formed an upper surface thereof. The adhesive layer 13c is made of a semi-hardened thermosetting resin. In this case, a die attach film formed by a semi-hardened resin having a sheet shape is adhered to a semiconductor wafer of which semiconductor chips 13a are not yet separated into pieces, and thus the adhesive layer is formed. The component holding nozzle 12 holding the first semiconductor component 13 is moved on the circuit board 5, and the first semiconductor component 13 is located on a mounting position.

Next, as shown in FIG. 2(c), the component holding nozzle 12 holding the first semiconductor component 13 is moved downward, and the adhesive layer 13c is directly contacted to a surface-modified resin layer on a surface of the circuit board 5. Subsequently, as shown in FIG. 2(d), the first semiconductor component 13 is pressed onto the circuit board 5 while the first semiconductor component 13 is heated by the heater built in the component holding nozzle 12. With such a configuration, the adhesive layer 13c in the semi-hardened state is thermally cured. In this case, since wettability is greatly improved by modifying the resin surface 5a of the circuit board 5 in the whole process, the adhesive layer 13c in the semi-hardened state rapidly flows on the resin surface 5a, and is satisfactorily adhered onto the resin surface 5a without residual of bubbles in the adhesive layer.

After a predetermined heat-pressing time elapses, as shown in FIG. 3(a), the component holding nozzle 12 is moved upward from the circuit board 5, and is separated from the first semiconductor component 13. In this case, since the adhesive layer 13c may not be exfoliated and deviated by closely adhering to the resin surface 5a, the component holding nozzle 12 is moved upward before the adhesive layer 13c is completely thermally cured, and can be separated from the first semiconductor component 13. With such a configuration, the heat pressing time is reduced up to about 0.2 seconds, whereas the heat pressing time has been required several seconds in a conventional component bonding process using the die attach film. Thus it is possible to greatly improve productivity.

Then, as shown in FIG. 3(b), the first semiconductor component 13 of the other mounting object is similarly bonded to the circuit board 5 by the heat pressing, the heat pressing for all the first semiconductor components 13 is complete, and then the curing process is performed on the circuit board 5. That is, the circuit board 5 after completion of the heat pressing is placed in the curing oven 14, and is maintained at a predetermined curing temperature during a predetermined time. Thereby, the thermal curing of the adhesive layer 13c is complete, and bonding the first semiconductor component 13 to the circuit board 5 is complete. In addition, when the thermal curing reaction is sufficiently performed in the heat pressing process as shown in FIG. 2(d), the other curing process shown in FIG. 3(c) may be omitted.

Then, the circuit board 5 having the first semiconductor component 13 bonded thereto is sent to the plasma treatment apparatus 1 again, and as shown in FIG. 4(a), is placed on the lower electrode 3 in the vacuum chamber 1a with a posture in which the first semiconductor component 13 faces upward. Then, as shown in FIG. 4(b), plasma discharge is generated in the treatment chamber 2, and thus the upper surface of the resin layer 13 made of resin is modified by the plasma treatment. Then, the circuit board 5 after the surface modification is sent to the component mounting apparatus 9 again as shown in FIG. 5(a), and is held by the conveying tool 11.

Subsequently, as shown in FIG. 5(b), the component holding nozzle 12 holding a second semiconductor component 23 is moved onto the circuit board 5, and its position is adjusted to the position of the first semiconductor component 13. The second semiconductor component 23 is a semiconductor component having the same configuration as the first semiconductor component 13, and is configured so that an adhesive layer 23c is formed on the lower surface of a semiconductor chip 23a having a resin layer 23b formed on the upper surface thereof. The adhesive layer 23c is formed by adhering the die attach film similarly to the adhesive layer 13c. In addition, the exterior size of the second semiconductor component 23 is set further smaller than the first semiconductor component 13 so as not to disturb a wire bonding for the first semiconductor component 13 in a state where the second semiconductor component 23 is laminated on the first semiconductor component 13.

Next, as shown in FIG. 5(c), the component holding nozzle 12 holding the second semiconductor component 23 is moved downward, and the adhesive layer 23c is directly contacted to the surface-modified resin layer 13b on the surface of the first semiconductor component 13. Subsequently, as shown in FIG. 5(d), the second semiconductor component 23 is pressed onto the first semiconductor component 13 while the second semiconductor component 23 is heated by the heater built in the component holding nozzle 12. With such a configuration, the adhesive layer 23c in the semi-hardened state is thermally cured. In this case, since wettability is greatly improved by modifying the resin surface 13d of the first semiconductor component 13 in the whole process, the adhesive layer 23c in the semi-hardened state rapidly flows on the resin surface 13d, and is satisfactorily adhered onto the resin surface 13d.

Then, after the predetermined heat-pressing time elapses, as shown in FIG. 6(a), the component holding nozzle 12 is moved upward, and is separated from the second semiconductor component 23. With such a configuration, a 2-layer laminated body 15 in which the first semiconductor component 13 and the second semiconductor component 23 are laminated is formed on the circuit board 5. In this case, similarly to FIG. 2(d), since the adhesive layer 23c may not be exfoliated and deviated by closely adhering to the resin surface 13d, the component holding nozzle 12 is moved upward before the adhesive layer 23c is completely thermally cured, and can be separated from the second semiconductor component 23. With such a configuration, similarly, the heat pressing time is reduced, and thus it is possible to greatly improve productivity.

Then, as shown in FIG. 6(b), similarly, forming the other 2-layer laminated body 15 on the circuit board 5 is complete, and then the curing process is performed on the circuit board 5. That is, the circuit board 5 after completion of forming the 2-layer laminated bodies 15 is placed in the curing oven 14, and is maintained at a predetermined curing temperature during a predetermined time. Thereby, the thermal curing of the adhesive layer 23c is complete, and forming the 2-layer laminated body 15 is complete. In addition, when the thermal curing reaction is sufficiently performed in the heat pressing process as shown in FIG. 5(d), the other curing process shown in FIG. 6(c) may be omitted.

Then, the circuit board 5 having the 2-layer laminated bodies 15 formed thereon is sent to the wire bonding process, connection terminals formed on an outer peripheral portions of the semiconductor chips 13a and 23a is connected to the electrodes of the circuit board 5 by the bonding wire 16 as shown in FIG. 6(d), and thus a mounted body having a chip-on-chip structure in which two electronic components are laminated on the circuit board 5 is completely formed.

As described above, in the component bonding for forming the mounted body having the chip-on-chip structure, the surface modification of the resin layer is performed by the plasma treatment, and thus it is possible to improve adhesion between the resin layer and the adhesive layer previously formed on the semiconductor component. Thereby, it is possible to improve productivity in the heat pressing process by greatly reducing the time required for the component bonding, as compared with the conventional process applied when the component bonding is performed by using the die attach film.

Embodiment 2

FIGS. 7, 8, 9, and 10 are diagrams for explaining a process of component laminating method according to embodiment 2 of the invention. In the component laminating method, a plurality of components each of which has a resin layer formed on one surface thereof and a thermosetting adhesive layer formed on the other surface thereof is laminated on the circuit board 5. In the embodiment 2, there is shown an example in which two semiconductor components are laminated with a spacer 24 interposed therebetween.

Figure 7:
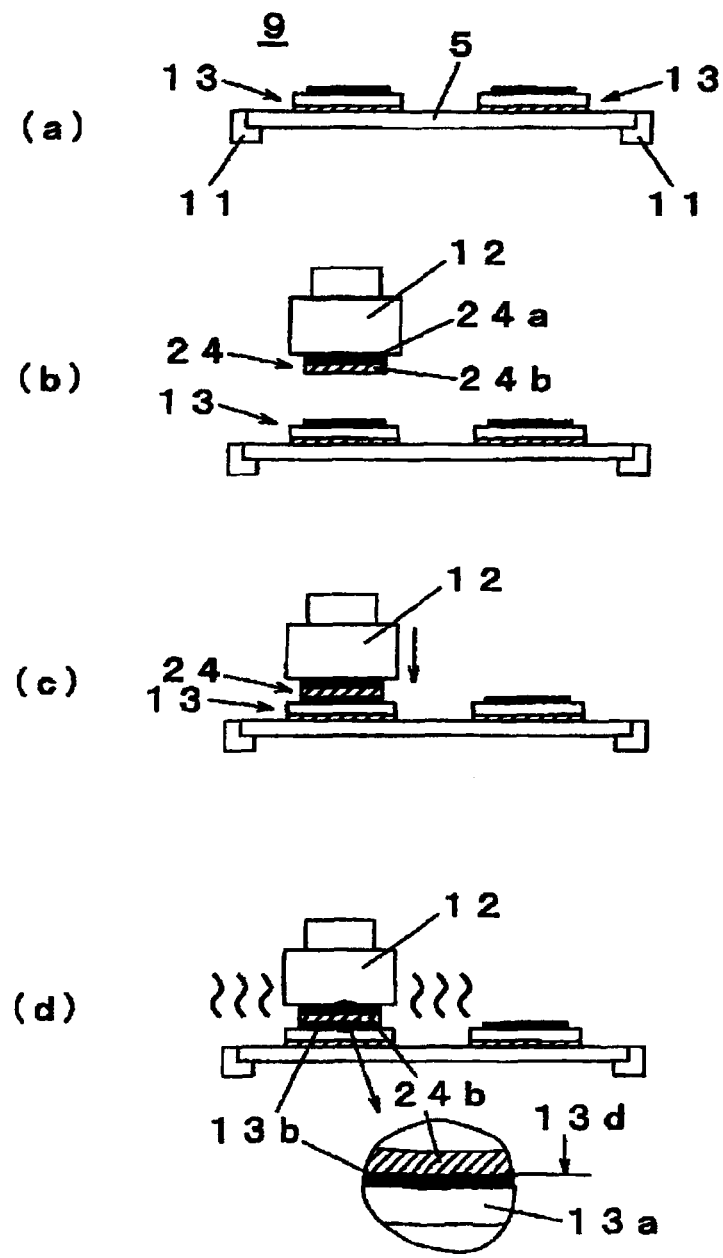
FIG. 7 is a diagram for explaining a process of a component laminating method according to an embodiment 2 of the invention.

In FIG. 7(*a*), the first semiconductor component 13 the same as shown in the embodiment 1 is bonded onto the circuit board 5 held by the conveying tool 11 of the component mounting apparatus 9. The first semiconductor component 13 is bonded to the circuit board 5 similarly to the method shown in FIGS. 1 to 4 in the embodiment 1.

Subsequently, as shown in FIG. 7(*b*), the component holding nozzle 12 holding the spacer 24 is moved onto the circuit board 5, and its position is adjusted to the position of the first semiconductor component 13. In a semiconductor apparatus having a configuration in which two semiconductor components having similar exterior size are laminated, the spacer 24 is used to be interposed between two components on purpose to secure a gap for the wire bonding of a lower layer component. The spacer 24 is configured so that an adhesive layer 24*b* is formed on a lower surface of a resin plate 24*a* made of resin. The adhesive layer 24*b* is formed by adhering the die attach film similarly to the adhesive layer 13*c*.

Next, as shown in FIG. 7(*c*), the component holding nozzle 12 holding the spacer 24 is moved downward, and the adhesive layer 24*b* is directly contacted to the surface-modified resin layer 13*b* on the surface of the first semiconductor component 13. Subsequently, as shown in FIG. 7(*d*), the spacer 24 is pressed onto the first semiconductor component 13 while the spacer 24 is heated by the heater built in the component holding nozzle 12. With such a configuration, the adhesive layer 24*b* in the semi-hardened state is thermally cured. In this case, since wettability is greatly improved by modifying the resin surface 13*d* of the first semiconductor component 13 in the whole process, the adhesive layer 24*b* in the semi-hardened state rapidly flows on the resin surface 13*d*, and is satisfactorily adhered onto the resin surface 13*d*.

Figure 8:
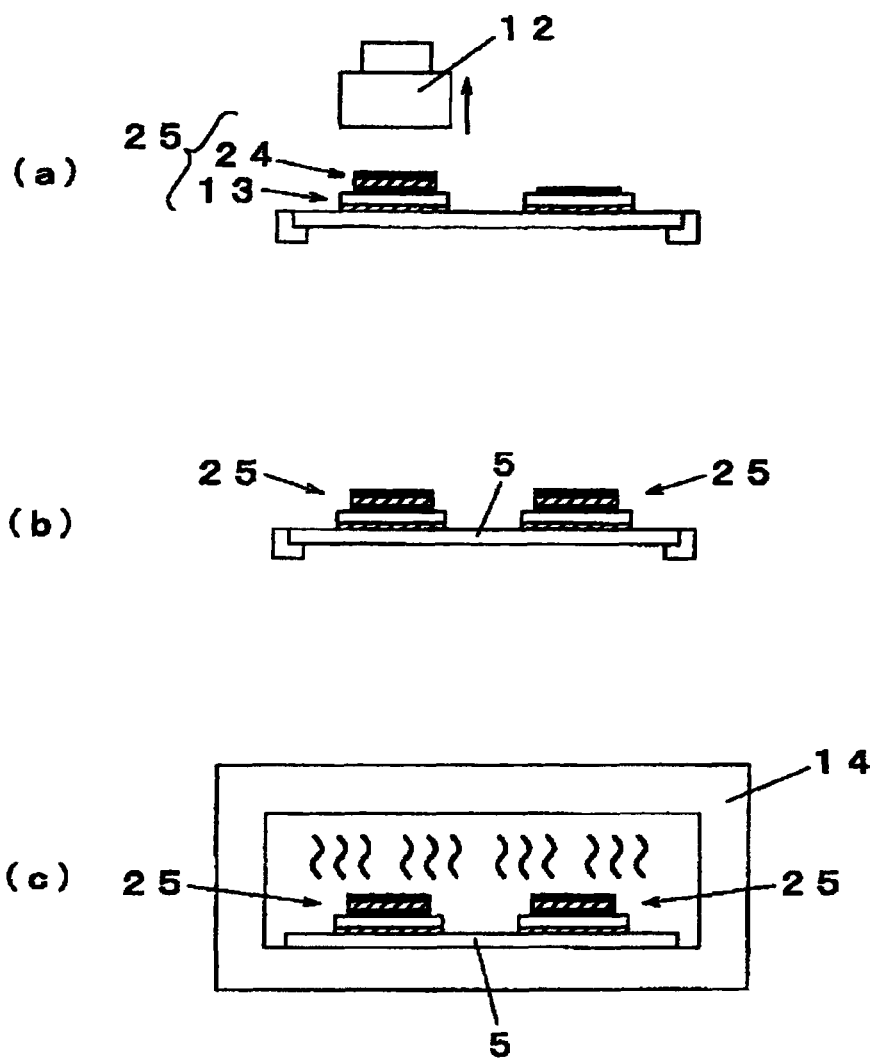
FIG. 8 is a diagram for explaining a process of the component laminating method according to the embodiment 2 of the invention.

Then, after the predetermined heat-pressing time elapses, as shown in FIG. 8(*a*), the component holding nozzle 12 is moved upward, and is separated from the spacer 24. With such a configuration, a 2-layer laminated body 25 in which the first semiconductor component 13 and the spacer 24 are laminated is formed on the circuit board 5. In this case, similarly to FIG. 2(*d*), since the adhesive layer 24*b* may not be exfoliated and deviated by closely adhering to the resin surface 13*d*, the component holding nozzle 12 is moved upward before the adhesive layer 24*b* is completely thermally cured, and can be separated from the spacer 24. With such a configuration, similarly, the heat pressing time is reduced, and thus it is possible to greatly improve productivity.

Then, as shown in FIG. 8(*b*), similarly, forming the other 2-layer laminated body 25 on the circuit board 5 is complete, and then the curing process is performed on the circuit board 5. That is, the circuit board 5 after completion of forming the 2-layer laminated bodies 25 is placed in the curing oven 14, and is maintained at a predetermined curing temperature during a predetermined time. Thereby, the thermal curing of the adhesive layer 24*b* is complete, and forming the 2-layer laminated body 25 is complete.

Figure 4:
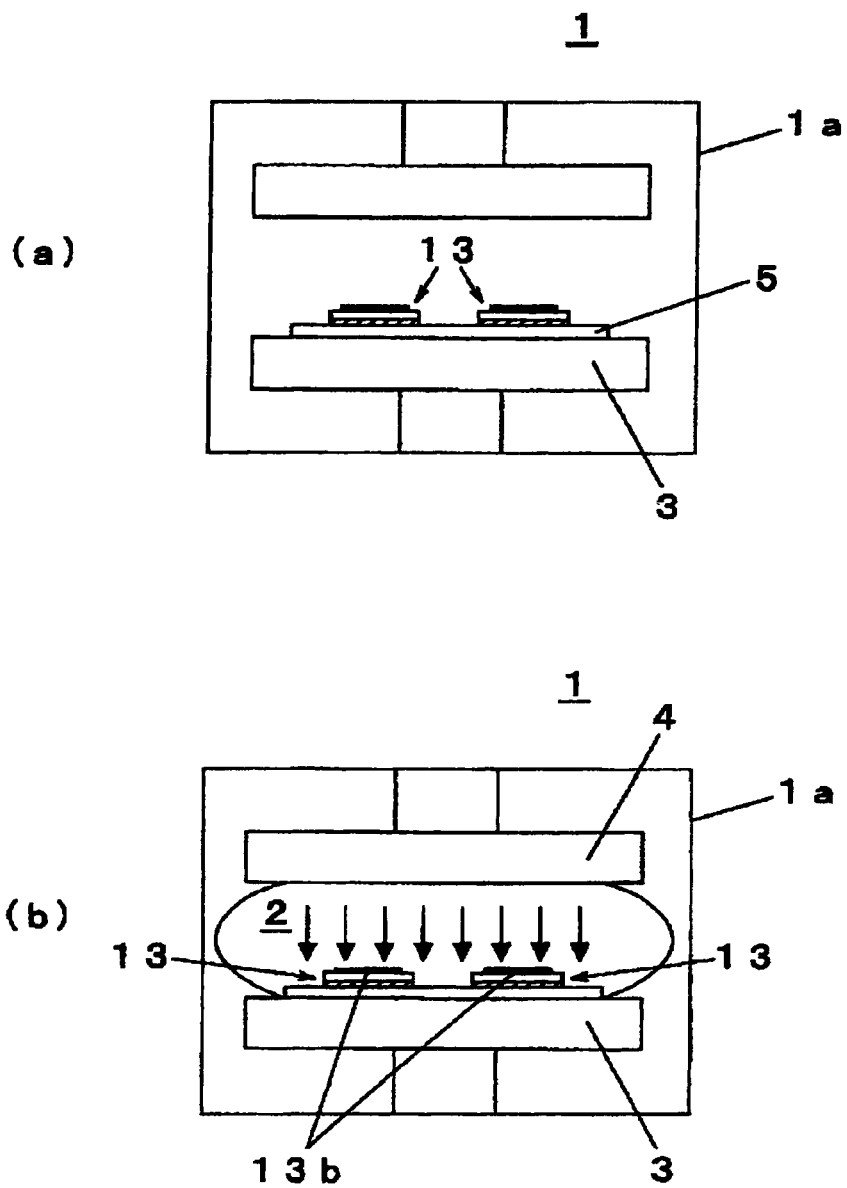
FIG. 4 is a diagram for explaining a process of the component bonding method according to the embodiment 1 of the invention.
Figure 5:
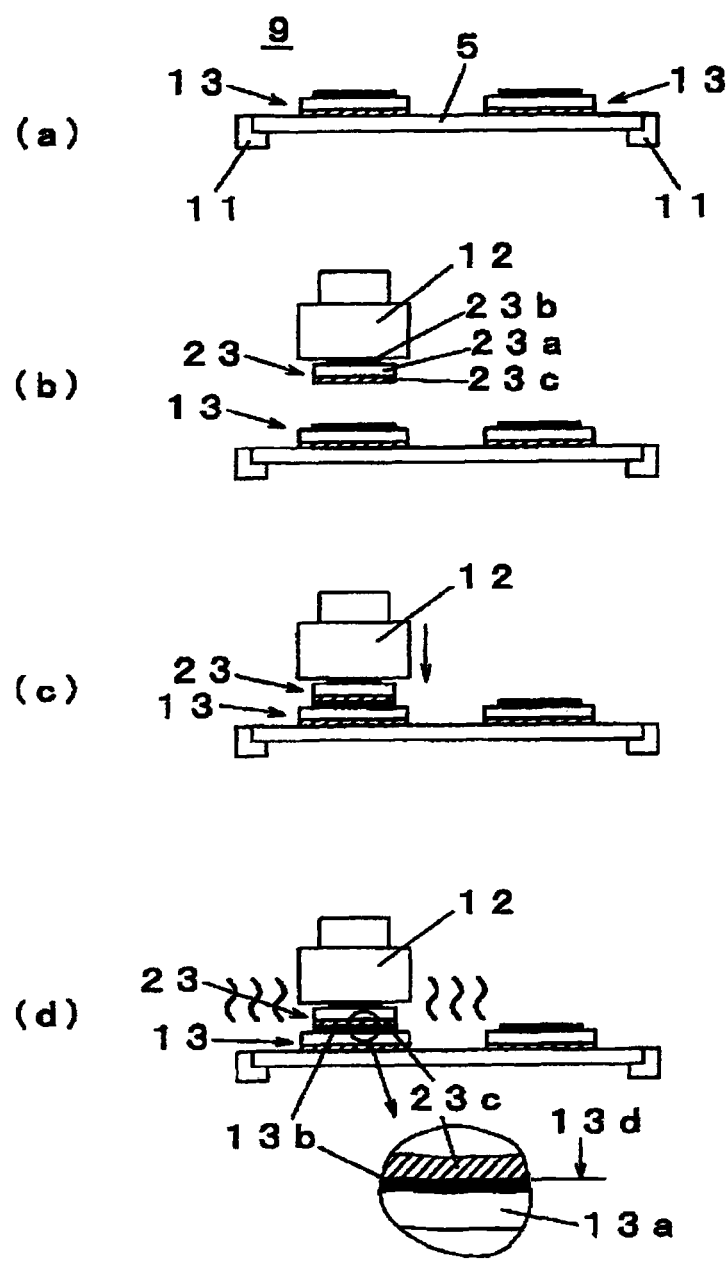
FIG. 5 is a diagram for explaining a process of the component bonding method according to the embodiment 1 of the invention.
Figure 6:
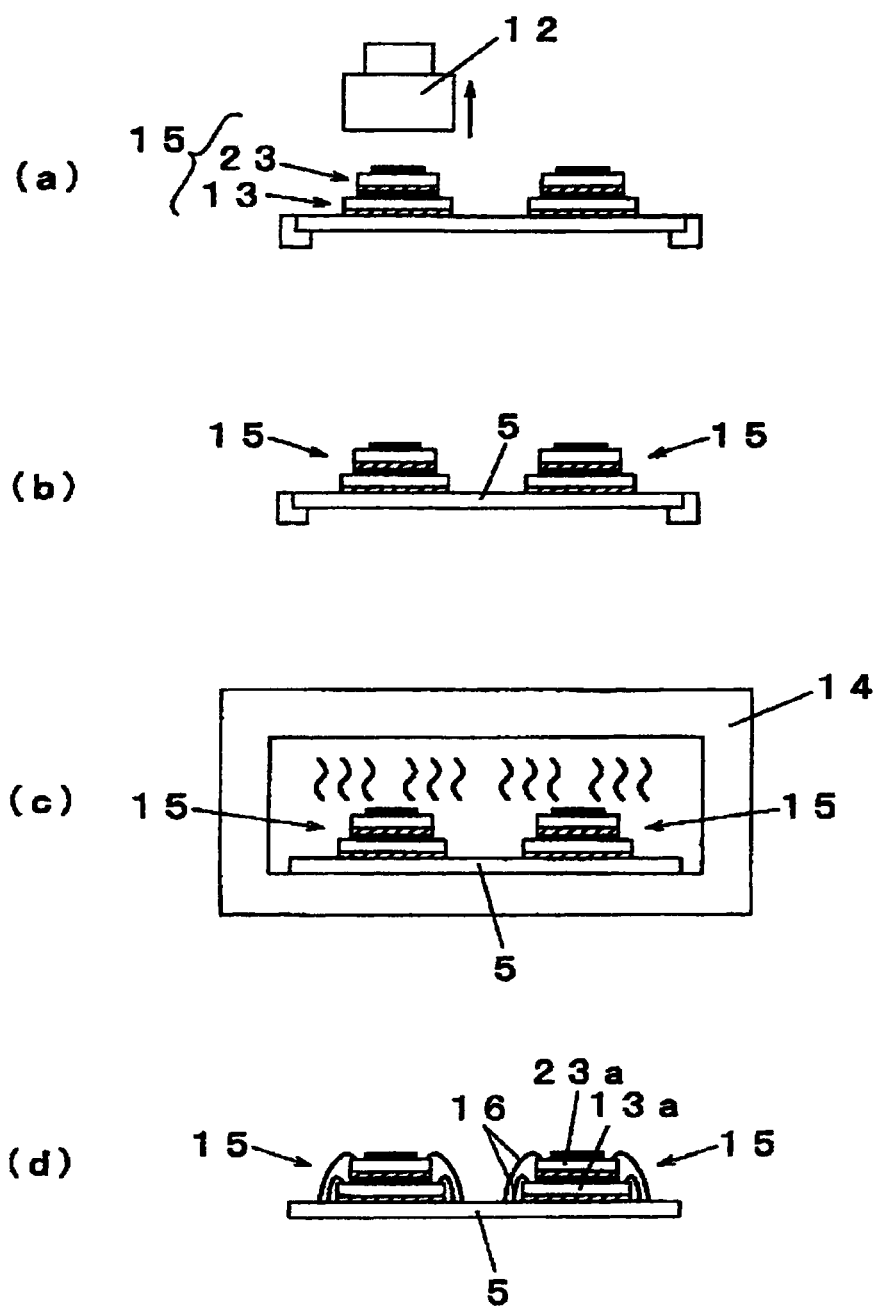
FIG. 6 is a diagram for explaining a process of the component bonding method according to the embodiment 1 of the invention.

Then, the circuit board 5 having the 2-layer laminated body 25 formed thereon is sent to the plasma treatment process again, and as shown in FIG. 4(*a*), is placed on the lower electrode 3 in the plasma treatment apparatus 1. Then, as shown in FIG. 4(*b*), plasma discharge is generated in the treatment chamber 2, and thus the upper surface of the resin plate 24*a* serving as a resin layer is modified by the plasma treatment. Then, the circuit board 5 after the surface modification is sent to the component mounting apparatus 9 again as shown in FIG. 9(*a*), and is held by the conveying tool 11.

Figure 9:
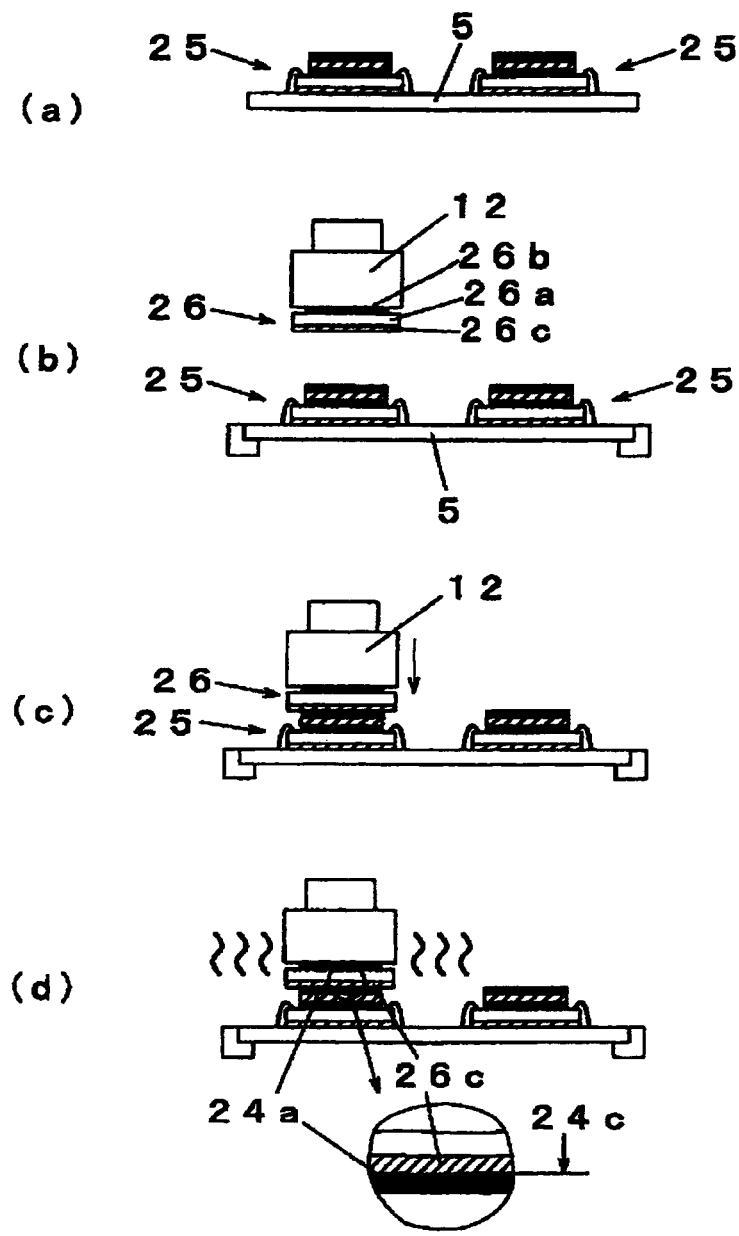
FIG. 9 is a diagram for explaining a process of the component laminating method according to the embodiment 2 of the invention.

Subsequently, as shown in FIG. 9(*b*), the component holding nozzle 12 holding a third semiconductor component 26 is moved onto the circuit board 5, and its position is adjusted to the position of the 2-layer laminated body 25. The third semiconductor component 26 is a semiconductor component having the same configuration as the first semiconductor component 13, and is configured so that an adhesive layer 26*c* is formed on the lower surface of a semiconductor chip 26*a* having a resin layer 26*b* formed on the upper surface thereof. The adhesive layer 26*c* is formed by adhering the die attach film similarly to the adhesive layer 13*c*.

Next, as shown in FIG. 9(*c*), the component holding nozzle 12 holding the third semiconductor component 26 is moved downward, and the adhesive layer 26*c* is directly contacted to the surface-modified resin plate 24*a* on the surface of the spacer 24. Subsequently, as shown in FIG. 9(*d*), the third semiconductor component 26 is pressed onto the spacer 24 while the third semiconductor component 26 is heated by the heater built in the component holding nozzle 12. With such a configuration, the adhesive layer 26*c* in the semi-hardened state is thermally cured. In this case, since wettability is greatly improved by modifying the resin plate 24*a* of the spacer 24 in the whole process, the adhesive layer 26*c* in the semi-hardened state rapidly flows on the resin surface 24*c*, and is satisfactorily adhered onto the resin plate 24*a*.

Figure 10:
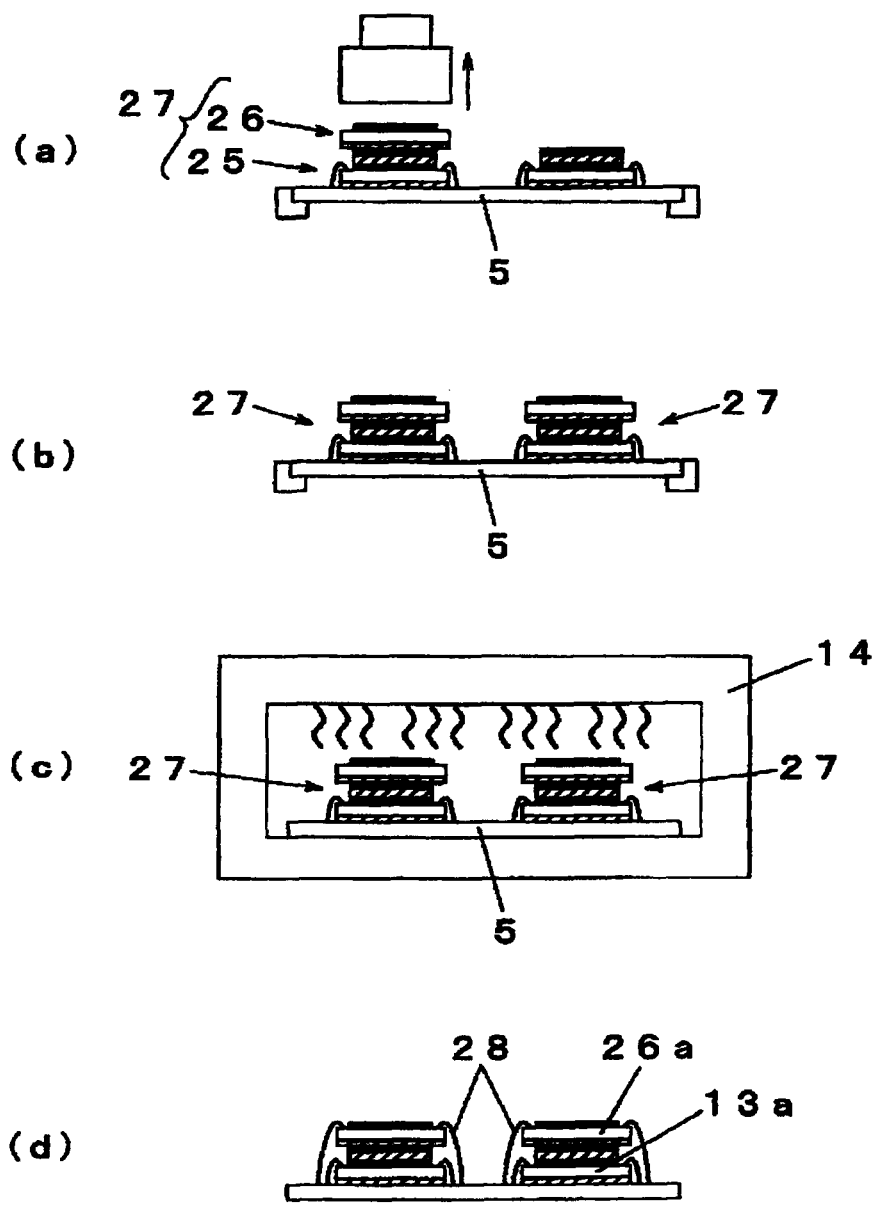
FIG. 10 is a diagram for explaining a process of the component laminating method according to the embodiment 2 of the invention.

Then, after the predetermined heat-pressing time elapses, as shown in FIG. 10(*a*), the component holding nozzle 12 is moved upward, and is separated from the third semiconductor component 26. With such a configuration, the 2-layer laminated body 25 in which the third semiconductor component 26 is laminated on the layer laminated body 25 again is formed on the circuit board 5. In this case, similarly to FIG. 2(*d*), since the adhesive layer 26*c* may not be exfoliated and deviated by closely adhering to the resin plate 24*a*, the component holding nozzle 12 is moved upward before the adhesive layer 26*c* is completely thermally cured, and can be separated from the third semiconductor component 26. With such a configuration, similarly, the heat pressing time is reduced, and thus it is possible to greatly improve productivity.

Then, as shown in FIG. 10(*b*), similarly, forming the other 3-layer laminated body 27 on the circuit board 5 is complete, and then the curing process is performed on the circuit board 5. That is, the circuit board 5 after completion of forming the 3-layer laminated bodies 27 is placed in the curing oven 14, and is maintained at a predetermined curing temperature during a predetermined time. Thereby, the thermal curing of the adhesive layer 26*c* is complete, and forming the 3-layer laminated body 27 is complete. In addition, when the thermal curing reaction is sufficiently performed in the heat pressing process as shown in FIG. 9(*d*), the other curing process shown in FIG. 10(*c*) may be omitted.

Then, the circuit board 5 having the 3-layer laminated bodies 27 formed thereon is sent to the wire bonding process, connection terminals formed on an outer peripheral portions of the semiconductor chips 13*a* and 26*a* is connected to the electrodes of the circuit board 5 by the bonding wire 28 as shown in FIG. 10(*d*), and thus a mounted body having a chip-on-chip structure in which the two first semiconductor component 13 and third semiconductor component 26 are laminated on the circuit board 5 with the 3-layer laminated body 27 interposed therebetween is completely formed.

As described above, the component laminating method employs the processes of mounting the first semiconductor component 13 serving as a first component on the circuit board 5, modifying a surface of the resin layer 13b of the first semiconductor component 13 by the plasma treatment using oxygen gas or argon gas as plasma generation gas, holding the spacer 24 serving as a second component by using the component holding nozzle 12 having the heater, contacting the adhesive layer 24b of the spacer 24 to the surface-modified resin layer 13b, and curing thermally the adhesive layer 24b by using the heater. In addition, the component holding nozzle 12 is separated from the spacer 24 before the adhesive layer 24b of the spacer 24 is completely thermally cured.

Likewise, in the process of laminating the third semiconductor component 26 on the 2-layer laminated body 25, the spacer 24 and third semiconductor component 26 correspond to the first component and the second component, respectively, and the process mentioned above is applied to lamination of these two components. That is, the component laminating method according to the embodiment 2 is performed on the plurality of components including at least the first component and the second component. Also in the component laminating method, it is possible to obtain the same effect as the embodiment 1 for every layer, and the effect particularly becomes remarkable as the number of laminated layers increases.

The invention has been described in detail with reference to the specified embodiments, but it will be readily apparent to those skilled in the art that obvious modifications, derivations, and variations can be made without departing from the technical scope described in the invention. This application is based on Japanese Patent Application No. 2006-051729 filed on the 28th day of Feb. in 2006, which is incorporated herein by reference.

INDUSTRIAL APPLICABILITY

The component bonding method and the component laminating method according to the invention has an effect that productivity of a heat pressing process can be improved, and is available in a field in which a semiconductor component having a thermosetting adhesive layer is bonded to a circuit board having a resin layer formed on a surface thereof by a heat pressing.

The invention claimed is:

1. A component bonding method of bonding a semiconductor component having a semi-hardened thermosetting resin adhesive layer to a circuit board having a resin layer, the component bonding method comprising the steps of:
    modifying a surface of the resin layer by performing a plasma treatment under an oxide gas or argon gas atmosphere;
    holding the semiconductor component having the semi-hardened adhesive layer by using a component holding nozzle having a heater built in;
    contacting the semi-hardened adhesive layer of the semiconductor component to the surface-modified resin layer;
    heating the semiconductor component by using the heater to thermally cure the semi-hardened adhesive layer of the semiconductor component; and
    separating the component holding nozzle having the heater from the semiconductor component to stop heating the semiconductor component before the adhesive layer is completely thermally cured.

2. The component bonding method according to claim 1, wherein the plasma treatment is performed by impinging charged particles in an energy band capable of selectively removing bond groups other than hydrophilic bond groups onto the surface of the resin layer.

3. The component bonding method according to claim 1, wherein the adhesive layer is not moved after the component holding nozzle is separated.

4. A component laminating method of laminating on a circuit board a plurality of components each of which has a resin layer and a semi-hardened thermosetting resin adhesive layer, the plurality of components include at least a first component and a second component, the component laminating method comprising the steps of:
    mounting the first component on the circuit board;
    modifying a surface of the resin layer of the first component by performing a plasma treatment under an oxide gas or argon gas atmosphere;
    holding the second component having the semi-hardened adhesive layer by using a component holding nozzle having a heater built in;
    contacting the semi-hardened adhesive layer of the second component to the surface-modified resin layer of the first component;
    heating the second component by using the heater to thermally cure the semi-hardened adhesive layer of the second component; and
    separating the component holding nozzle having the heater from the second component to stop heating the second component before the adhesive layer is completely thermally cured.

5. The component laminating method according to claim 4, wherein the plasma treatment is performed by impinging charged particles in an energy band capable of selectively removing bond groups other than hydrophilic bond groups onto the surface of the resin layer.

6. The component bonding method according to claim 4, wherein the adhesive layer is not moved after the component holding nozzle is separated.

* * * * *